United States Patent

Bimer et al.

[11] Patent Number: 4,609,103
[45] Date of Patent: Sep. 2, 1986

[54] SEMICONDUCTOR SLICE CASSETTE CARRIER

[75] Inventors: Thomas C. Bimer, Albuquerque, N. Mex.; Malvern L. Creps, Plano; Edwin G. Millis, Dallas, both of Tex.

[73] Assignee: Texas Instruments Incorporated, Dallas, Tex.

[21] Appl. No.: 644,282

[22] Filed: Aug. 27, 1984

[51] Int. Cl.4 .............................................. B65D 85/00
[52] U.S. Cl. ................................... 206/328; 206/454; 206/583; 211/41; 220/344; 248/548
[58] Field of Search ............... 206/327, 454, 583, 387, 206/455, 328, 329; 220/335, 344, 371; 312/8, 10, 244, DIG. 33; 248/562, 565; 211/4, 40, 41

[56] References Cited

U.S. PATENT DOCUMENTS

| | | | |
|---|---|---|---|
| 1,839,902 | 1/1932 | Straubel | 206/44 B |
| 2,710,093 | 6/1955 | Raker | 312/244 |
| 3,469,809 | 9/1969 | Reznick et al. | 248/562 |
| 3,907,116 | 9/1975 | Wolf et al. | 206/387 |
| 3,923,197 | 12/1975 | Kuhn | 220/344 |
| 4,077,518 | 3/1978 | Kisslinger et al. | 206/583 |
| 4,200,256 | 4/1980 | Thiel | 248/562 |
| 4,224,765 | 9/1980 | Song | 220/371 |
| 4,228,902 | 10/1980 | Schulte | 206/454 |
| 4,275,942 | 6/1981 | Steidl | 220/335 |
| 4,358,908 | 11/1982 | Song | 220/371 |
| 4,460,085 | 7/1984 | Jantzen | 312/DIG. 33 |

Primary Examiner—William Price
Assistant Examiner—David T. Fidei
Attorney, Agent, or Firm—Richard A. Bachand; N. Rhys Merrett; Melvin Sharp

[57] ABSTRACT

A portable carrier (10) for storage and transportation of semiconductor slice cassettes in a clean room environment which shields the semiconductor slices from VLF air in people occupied areas includes a base (12), a pair of spring-mounted cradles (14) mounted on base (12) for supporting the semiconductor slice cassette and a cover (16) for disposal on base (12) to provide a sealed volume. Carrier (10) also includes a latch (20) for removably coupling cover (16) onto base (12). Latch (20) includes a handle (22) at the terminal end thereof to facilitate handling and transporting of carrier (10) when cover (16) is locked in place on base (12). A latch tube (24) is mounted proximate the center of base (12) and cooperates with latch (20) to couple cover (16) onto base (12). A pair of particle filters (26) are mounted on base (12) and positioned beneath cradles (14) to equalize the pressure on the interior and exterior of carrier (10) and thus reduce the pressure drop across seal (18) to zero under normal conditions. A pair of guides (28) are positioned proximate the rear of base (12) to either side thereof and outside seal (18). Guides (28) are adapted to be disposed through apertures provided in cover (16) to facilitate placement of cover (16) onto base (12) and prevent misalignment thereof.

5 Claims, 11 Drawing Figures

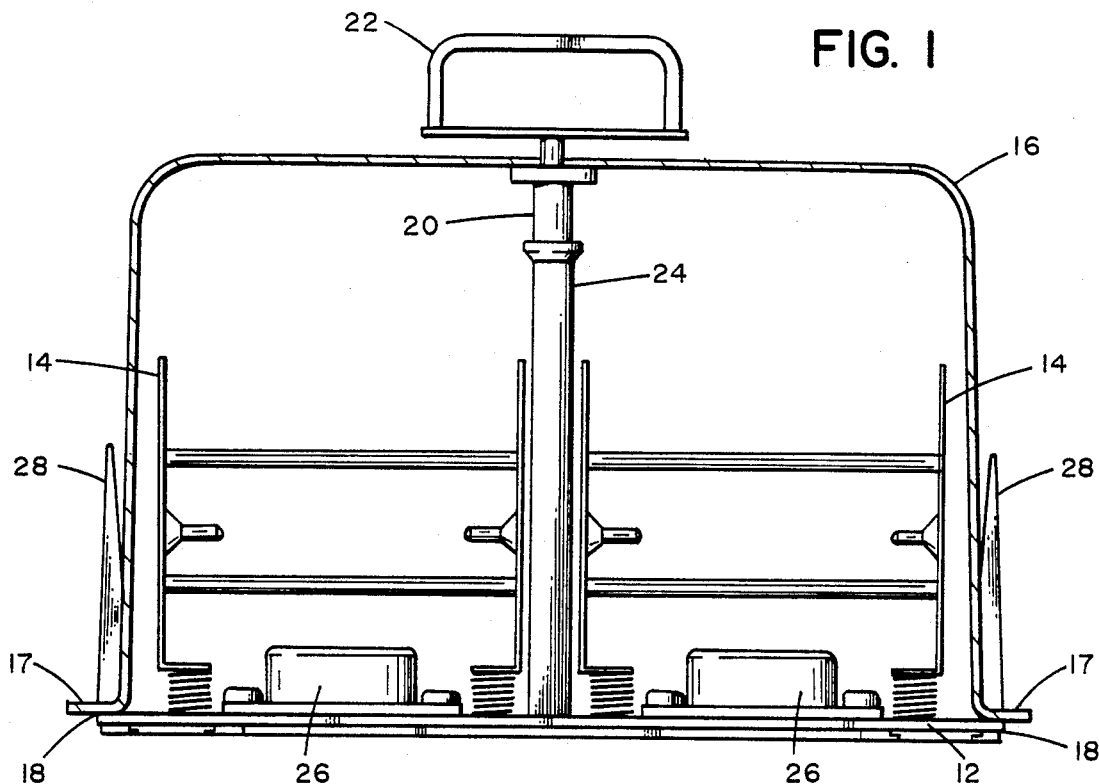
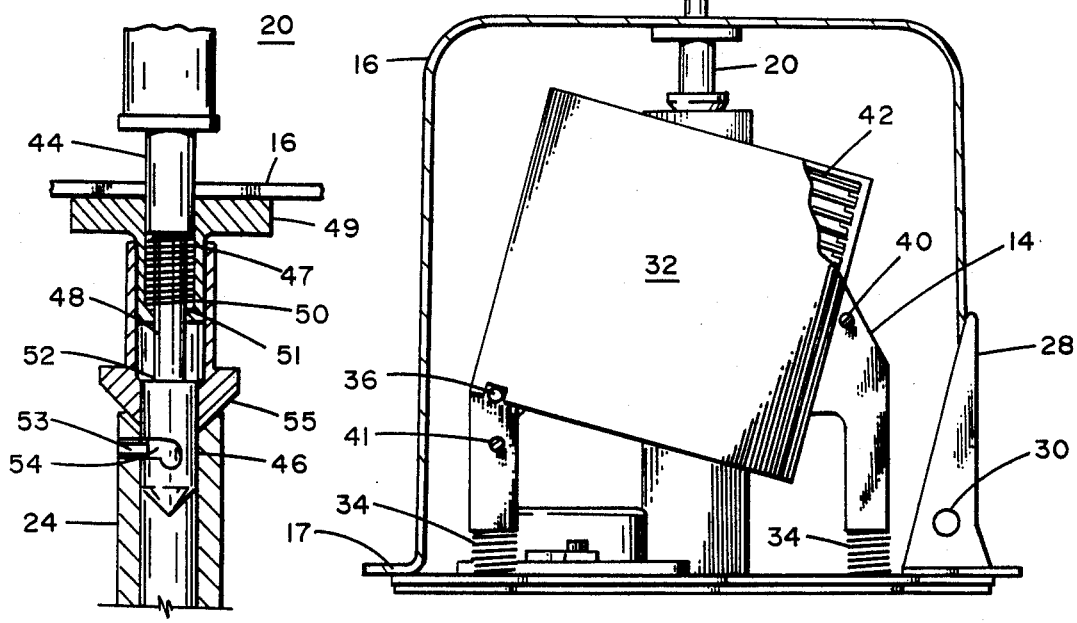

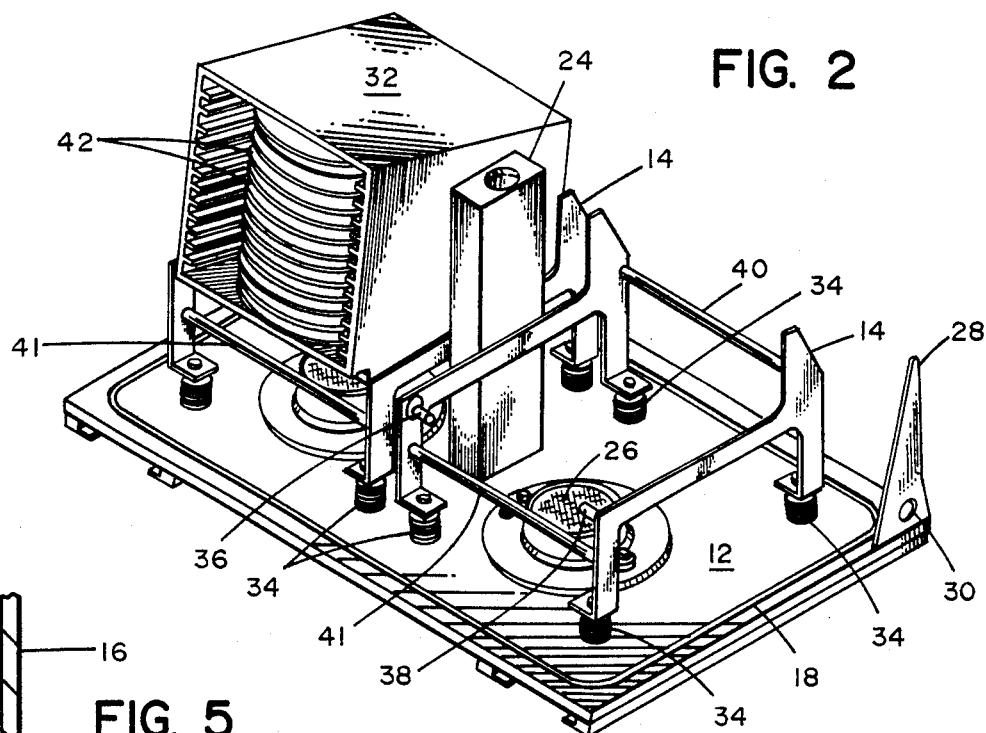
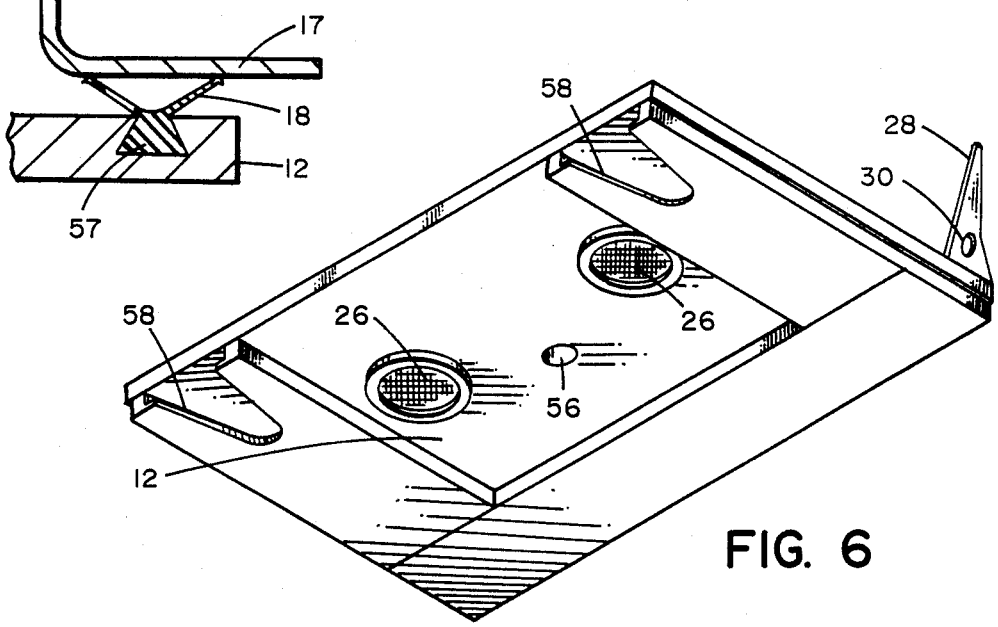

SEMICONDUCTOR SLICE CASSETTE CARRIER

TECHNICAL FIELD OF THE INVENTION

This invention relates to portable carriers for storage and transportation of semiconductor slice cassettes and more specifically to a carrier including means for shielding the semiconductor slices from particulate contamination.

BACKGROUND OF THE INVENTION

Integrated circuit fabrication begins with a thin slice of single crystal semiconductor, usually silicon, and employs a combination of physical and chemical processes to create the integrated circuit structure. The fabrication process is very sensitive to particulate contamination and airborne particulates must be minimized during the fabrication sequence, as even very small particles on the wafer surface may cause device defects. A reduced particle fabrication ambience is normally achieved by the use of vertical laminar-flow (VLF) clean rooms. Lint-free garments are normally worn by persons working within those clean rooms to minimize operator-borne particles.

Tests have shown, however, that clean rooms can only reduce airborne particulate levels to approximately 10-20 particles per cubic foot in areas where people are working, though clean levels of less than one particle per cubic foot can be achieved in areas aerodynamically isolated from people. Thus, where particle contamination densities of less than one particle per cubic foot are required, the semiconductor slices cannot be exposed to VLF air in a clean room occupied by people. A need arises therefore for a container or carrier for storing and transporting semiconductor slice cassettes within the clean room that shields the slices from this VLF air. Various snap-top plastic boxes are currently in use for storage and transportation of slice cassettes within the clean room environment. Those boxes do not, however, have features to reduce particulate contamination and thus do not adequately protect the slices from the people-occupied environment.

The present invention improves upon the prior art by providing a carrier for semiconductor slice cassettes that shields the slices from people-occupied environments. The carrier is designed for storage and transportation of the semiconductor slices cassette within the clean room and maintains a clean environment around the slices.

SUMMARY OF THE INVENTION

The present invention disclosed and described herein comprises a portable carrier for storage and transportation of semiconductor slice cassettes in a clean room environment which shields the semiconductor slices from VLF air in people-occupied areas and thus reduces slice particle contamination.

The carrier includes a base, a pair of spring mounted cradles positioned on the base to receive the semiconductor slice cassette, and a cover for disposal on the base to provide a sealed volume. The cover is removably coupled to the base and latches into a base-mounted latch tube positioned at the center of the carrier. When positioned on the base, the cover is sealed thereto via a contact seal fitted into a dovetailed slot in the base to thereby form a leak-tight joint.

Two large area high-efficiency particle filters are mounted on the base to filter any air entering the carrier when the carrier is sealed. The filters equalize the pressure inside and outside the carrier and thus reduce the pressure drop across the seal to zero under normal conditions. During opening and closing of the carrier, low pressure air is directed through one or both filters to provide an outward flow of air at the sealing surfaces so that any particulate contamination is swept out of the carrier enclosure.

A guide system is provided to facilitate placement and removal of the cover on the base. The guide system comprises a pair of guide pins located at the rear of the base at either side thereof. The guide pins are designed to be received in apertures located in the cover to facilitate alignment and placement of the cover onto the base. The guide pins are positioned outside the seal and are thus external to the clean volume of the carrier to prevent any abraded particles generated by the frictional contacting of the guide pins and the cover from reaching the semiconductor slices. Locking guides are provided on the bottom surface of the carrier to facilitate attachment of the carrier to a supporting platform.

BRIEF DESCRIPTION OF THE DRAWINGS

For a more complete understanding of the present invention and the advantages thereof, reference is now made to the following description taken in conjunction with the accompanying Drawings in which:

FIG. 1 is a sectional view of the carrier of the present invention;

FIG. 2 is a perspective view of the carrier of the present invention with the cover removed and with one semiconductor slice cassette in place;

FIG. 3 is sectional side view of the carrier of the present invention showing semiconductor slices loaded into a slice cassette positioned in a cradle;

FIG. 4 is a sectional view of the latch mechanism;

FIG. 5 is a sectional view showing the sealing of the cover onto the base of the carrier;

FIG. 6 is a bottom view of the carrier of the present invention;

DETAILED DESCRIPTION OF THE PREFERRED EMBODIMENTS

Figure 7:
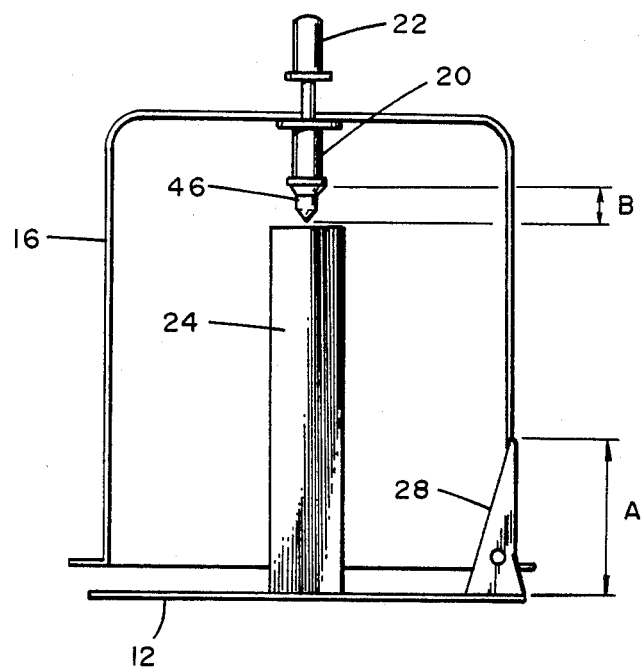
FIG. 7 illustrates the cooperation of the latch mechanism and guide pins during placement of the cover onto the base.

Referring to the Drawings wherein like reference numerals designate like or corresponding parts throughout, FIG. 1 illustrates a sectional view of the carrier of the present invention. As shown in FIG. 1, carrier 10 comprises a base 12, a pair of spring-mounted cradles 14 mounted on base 12 for each supporting a semiconductor slice cassette and a cover 16 for disposal on base 12 to provide a sealed volume. Cover 16 is preferably formed of plastic and may be vacuum/heated formed of polycarbonate material. Cover 16 is also preferably treated to prevent build-up of static electricity. Cover 16 includes outwardly extending flanges 17 which are sealed to base 12 on all sides by a double contact "v" seal 18, described hereinafter in greater detail with reference to FIG. 5. Seal 18 is disposed about the periphery of base 12 and forms a leak-tight joint between the cover and the base to prevent air flow between the interior and exterior of the carrier.

As also shown in FIG. 1, carrier 10 includes a latch 20 for removably coupling cover 16 onto base 12. Latch 20 includes a handle 22 at the terminal end thereof which is positioned above cover 16 to facilitate handling and transporting of the carrier once the cover is locked into place on the base. A latch tube 24 is mounted proximate the center of base 12 and cooperates with latch 20 as shown in FIG. 4 to couple cover 16 onto base 12.

A pair of large area high-efficiency particle filters 26 are mounted in apertures through base 12 and are positioned beneath cradles 14 to filter any air entering the carrier when the carrier is sealed. Filters 26 equalize the pressure on the interior and exterior of the carrier and thus reduce the pressure drop across seal 18 to zero under normal conditions. The filters thus account for changes in temperature and volume within the carrier and insure that air and its associated contaminates are not sucked or pulled into the carrier enclosure as the carrier tries to breathe. During the opening and closing of the carrier, low pressure air is directed through one or both of filters 26 to create a positive pressure inside the carrier and thus provide an outward flow of air over seal 18 to sweep any loose particles located in the area surrounding the seal away from the carrier.

A pair of guide members 28 are positioned proximate the rear of base 12 to either side thereof and outside seal 18. Guides 28 are adapted to be disposed through apertures provided in flanges 17 in cover 16 to facilitate placement of the cover onto the base and prevent misalignment thereof. Because the carrier will itself generate particles whenever there is rubbing or contacting of the constituent parts and thus introduce contaminates to the semiconductor slices, the carrier is designed to minimize such frictional contact and its adverse consequences. In this regard, guides 28 are preferably constructed of non-abrasive material, such as polished metal which has been shown to minimize particulate generation resulting from friction with cooperating surfaces of the cover during placement of the cover onto the base. Guides 28 are also tapered so that minimal contact between cover 16 and guides 28 will occur as the cover is removed and replaced. As shown in FIG. 1, guides 28 may be of a triangular configuration. The apertures in flange 17 are also preferably dimensioned so that minimal contact between the guides and the apertures will occur along the length of the guides. Because guides 28 are positioned outside the seal 18 and are thus external to the clean volume of the carrier, risk is reduced that abraded particles generated by the contacting of the guides and cover will reach the semiconductor slices. Guides 28 may also include holes 30 (FIGS. 2 and 3) which are located to facilitate use of the carrier in conjunction with automated handling mechanisms, e.g., robots, for transporting and handling the carrier.

FIG. 2 shows a perspective view of the carrier with the cover removed and with a semiconductor slice cassette 32 positioned in place on one of the cradles 14. It will be understood that in normal use, a slice cassette will be placed on each cradle 14. Cassette 32 is of conventional design and may be a plastic box of the type manufactured by Fluorware, Inc., Part No. PA182-60MB. As shown in FIG. 2, cradles 14 are mounted on springs 34 attached to base 12 and include pins 36 and 38 and rear bar 40 for cooperating with the surface of cassette 32 to provide support therefor. Because the frictional contact of cassette 32 and pins 36 and 38 and bar 40 of cradle 14 will, if not controlled, generate particles and thus contaminate the carrier volume, the pins and bar are non-abrasive and preferably of polished metal. Tests have shown that metal surfaces polished to a one to two microinch surface finish do not generate any noticeable particles, as such surfaces will not create sufficient friction to drag particles off the plastic cassette. Pins and bar 36, 38 and 40 are therefore provided with such a polished finish as are guides 28. A bar 41 joins the front portion of each cradle 14 to provide support thereto.

When positioned in one of cradles 14, as shown in FIG. 3, cassette 32 rests on the upper surfaces of pins 36 and 38 and bar 40 and is tipped slightly backward towards the rear of the base and is maintained at an angle of approximately 30° to the horizontal. This angle results in semiconductor slices 42 being directed toward the back of cassette 32 and at a sufficient angle so that the relative movement of the slices within the cassette is restricted. The slices are therefore prevented from rattling within the cassette during handling of the carrier and are also prevented from sliding out of the cassette slots. Preventing such movement is particularly critical because, as described above with respect to the cradle and cassette, the frictional contact of the slices against the plastic surface of the cassette will result in particulate generation and will thus also introduce undesirable contamination to the slices. Springs 34 further retard particle generation within the carrier by acting as shock absorbers and thus mechanically isolating the cassette and slices from bumps and jarring of the carrier during handling and transporting of the carrier.

FIG. 4 is a sectional view of latch 20. Latch 20 is a quarter-turn bullet latch and includes a handle 22 positioned on the exterior surface of cover 16. Handle 22 (FIGS. 1 and 3) is attached to a reciprocating rod 44 positioned on cover 16 and extending therethrough. Reciprocating rod 44 has a smaller diameter at the lower end thereof. Rod 44 has a tapered nose portion 46 attached thereto which forms an inverted frusto-conical surface. Nose portion 46 is dimensioned to slideably fit within tube 24. A spring 47 is attached about rod 44 and abuts against a shoulder 48.

A first sealing member 49 is disposed on the interior side of cover 16 and about reciprocating rod 44. Sealing member 49 is cylindrically shaped to provide a conduit 50 through which reciprocating rod 44 can pass. At the end of conduit 50 is an orifice 51 disposed therein dimensioned to allow rod 44 to pass therethrough. The lower end of spring 47 opposite shoulder 48 abuts against the inner surface of conduit 50 proximate orifice 51. Nose portion 46 is dimensioned with a diameter larger than rod 44 so that a shoulder 52 is formed therebetween. Shoulder 52 abuts against the bottom surface of conduit 50 proximate orifice 51 upon upward reciprocation of rod 44. Rod 44 can therefore be reciprocated downward until spring 47 is fully compressed or upward until shoulder 52 abuts against the bottom surface of conduit 50.

A locking pin 53 is disposed on the inner surface of tube 24 and extends radially inward. A mating slot 54 is disposed on the perimeter of nose portion 46 and is operable to coordinate with locking pin 53 to allow nose portion 46 to be reciprocated downward. When nose portion 46 is rotated, locking pin 53 will mate with slot 54 to lock nose portion 46 in place. If desired, a locking pin and mating slot may be disposed on each of the opposing side surfaces of tube 24 and nose portion 46. Spring 47 applies a tensioning force when biased to the latch mechanism through conduit 50.

A second sealing member 55 is slideably disposed about nose portion 46 and conduit 50. Sealing member 55 is tubular shaped with the lower end thereof having a generally frusto-conical shape with an orifice disposed therein for allowing nose portion 46 to reciprocate therethrough. Sealing member 55 is press fit over conduit 50 of sealing member 49 and abuts against the upper portion of sealing member 49. The lower frusto-conical portion of sealing number 55 abuts against the upper periphery of tube 24. The upper periphery of tube 24 is generally of an inverted frusto-conical shape to mate with the lower frusto-conical portion of sealing member 55.

The sealing members 49 and 55 create a sealed volume about latch 20 and thus insure that when latch 20 is disposed into tube 24 to couple cover 16 onto base 12, any particles generated by the contacting of the constituent components of latch 20 are confined within tube 24. Those particles may be later evacuated from tube 24 by applying a vacuum line to an orifice 56 (FIG. 6) provided at the terminal end of tube 24 and extending through base 12 to the exterior of the carrier. Because nose portion 46 and the perimeter of tube 24 are both frusto-conical shaped, sharp edges are minimized and particle generation occuring as a result of the contacting of the two surfaces is reduced and any particles generated are inclined to fall into the tube.

Referring now to FIG. 5, the details of "v" seal 18 are shown. As described above with respect to FIG. 1, seal 18 is a double contact "v" seal disposed about the periphery of base 12 and fitted into a dovetailed slot 57 provided therein. Seal 18 is comprised of resilient rubber and readily conforms to the outer flange 17 of cover 16 to thus provide a leak-tight joint. Because seal 18 is preferably of soft material, it readily conforms to slight variations in planarity that may be present in the cover flange.

FIG. 6 is a bottom view of the carrier of the present invention. Orifice 56 communicates with tube 24 and may be attached to a vacuum source, as previously described, to vacuum out trapped particles. As shown in FIG. 6, guide slots 58 are provided at the forward edges and to either side of base 12. Guide slots 58 may be constructed of strips of Delrin or other suitable low-friction material and are provided to matingly engage with cooperating protrusions located on appropriate supporting platforms or tables so that the carrier may be supported and stored in a stable position if desired.

FIG. 7 omits cradles 14 for simplicity of illustration to show the interrelationship of guides 28 and latch portion 46 for positioning cover 16 onto base 12. As described above with respect to FIG. 1, guides 28 are provided to prevent misalignment of cover 16 onto base 12 and thus reduce the likelihood of cover 16 contacting cassettes 32 or cradles 14 and thus introducing particulate contamination to the semiconductor slices as the cover 16 is being installed. In this regard, guides 28 are specifically designed so that the height of the guides, referred to as "A" in FIG. 7, is greater than the length, referred to as "B" in FIG. 7, of portion 46 of latch 20 extending from the interior surface of cover 16. Cover 16 will thus contact guides 28 before portion 46 contacts tube 24 when the cover is being installed onto the base. The cover will therefore be in proper alignment with respect to base 12 before any latching action takes place.

Figure 8:
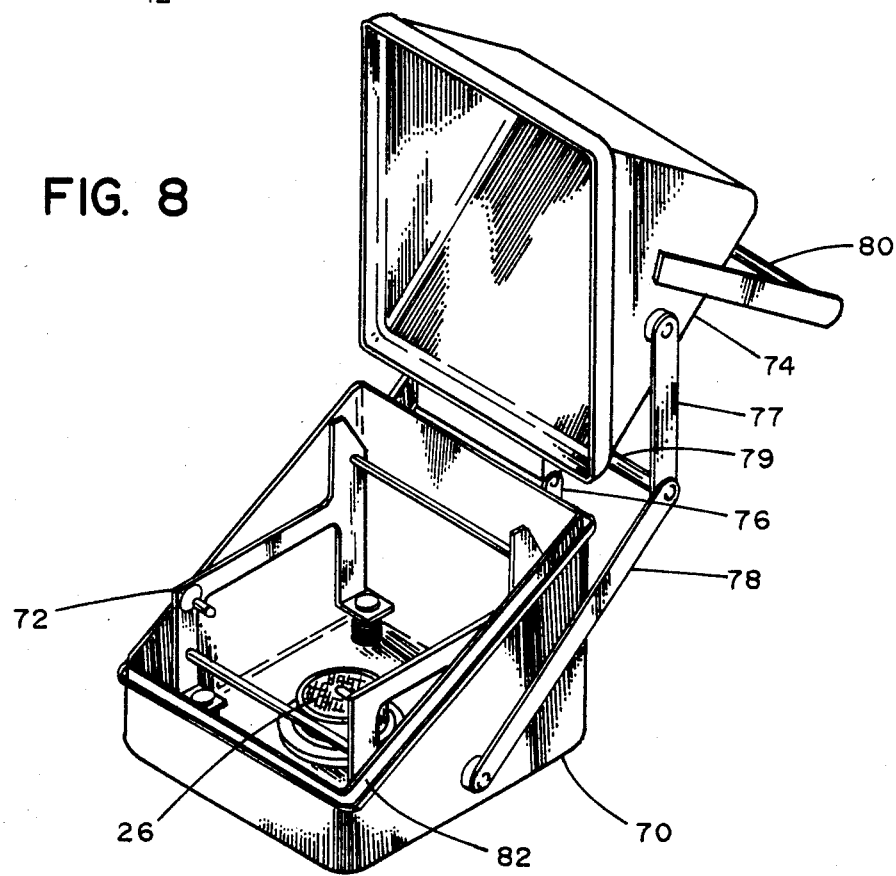
FIG. 8 illustrates an alternative embodiment of the carrier of the present invention.

FIG. 8 shows an alternative embodiment of the carrier of the present invention. As shown in FIG. 8, the carrier includes a rectangular housing 70, with an opening sloping downwardly from rear to front. A cradle 72 is mounted on springs within housing 70 for supporting a semiconductor slice cassette. A filter 26 is mounted in the bottom of housing 70. A cover 74 has a triangular cross-section and is coupled to housing 70 to provide a sealed volume. Cover 74 is pivotably secured to housing 70 at the rear portion thereof by hinges 76 and is also secured proximate the side of housing 70 by hinge arms 77 and 78 located on both sides thereof and interconnected by arm 79.

Figure 9:
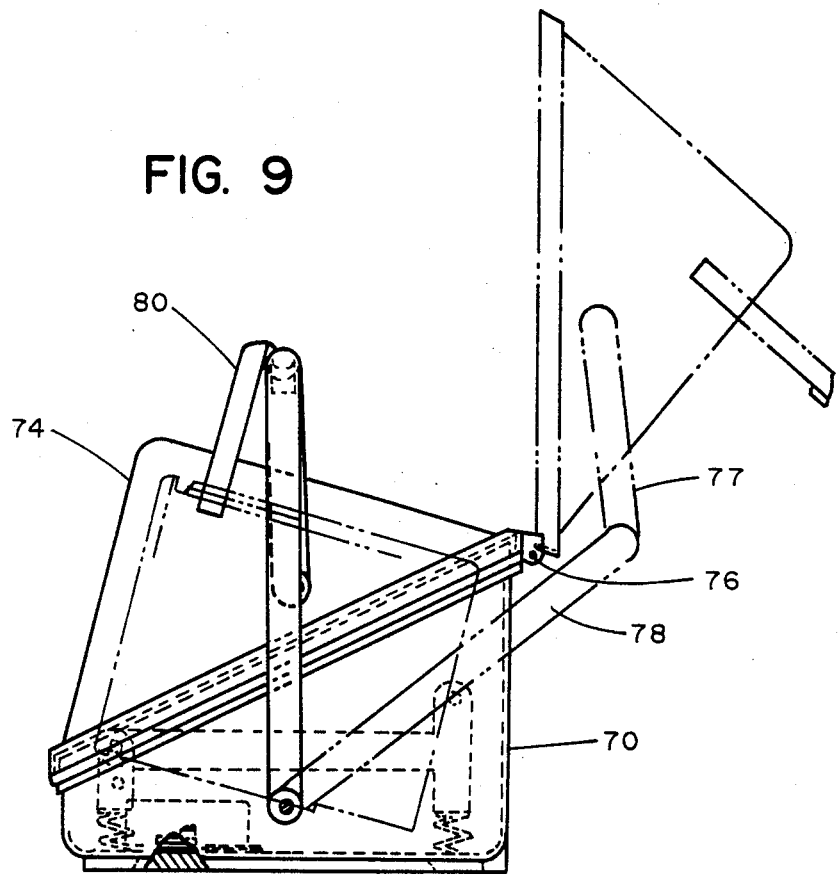
FIG. 9 is a side view of the carrier of FIG. 8 showing the raising and lowering of the cover onto the base in a full closed and a full opened position.

As best shown in FIG. 9, hinges 76 are positioned below the topmost edge of housing 70 so that as the hinges are rotated about their axis to allow lowering and raising of cover 74, any particles generated as a result of the frictional contacting of the hinges will be generated in an area below the carrier volume and will not be introduced into the carrier enclosure. A handle stop 80 is provided on the exterior surface of cover 74 which cooperates with arm 79 to facilitate handling of the carrier when the cover 74 is coupled onto housing 70. As shown in FIG. 9, handle stop 80 is designed to cooperate with hinge arms 77, 78 to latch cover 74 onto housing 70. Thus, when cover 74 is lowered onto housing 70, hinge arms 77, 78 are pulled in a forward direction so that hinge arms 77, 78 rest against handle stop 80 to restrict its travel and lock handle 79 in place.

Figure 10:
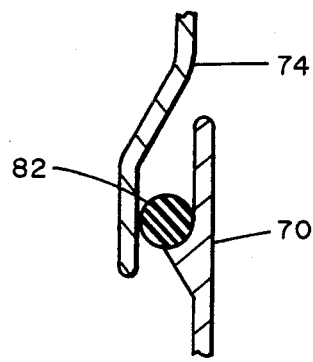
FIG. 10 illustrates the sealing of the cover of the carrier of FIG. 8 onto the base.
Figure 11:
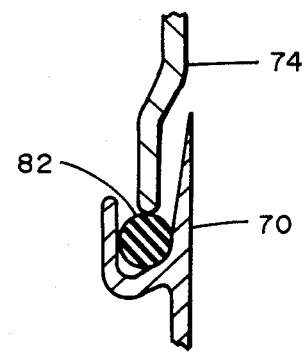
FIG. 11 illustrates an alternative sealing arrangement for the carrier of FIG. 8.

A contact seal 82 is provided about the peripheral upper edge of housing 70 for cooperating with cover 74 to provide a sealed enclosure. Seal 82 may be positioned on the outer surface of housing 70, as shown in FIG. 10, so that when cover 74 is disposed over housing 70, the outer flange of cover 74 is extended over the peripheral edge of housing 70 and is pressed against seal 82 to thereby provide a sealed volume. Alternatively, seal 82 may be fitted into a groove or slot provided about the periphery of housing 70. Thus when cover 74 is closed, the outer flange of 74 will fit within the groove and contact seal 82 as shown in FIG. 11 to thus seal the cover onto the base.

In summary, an apparatus has been disclosed for storing and transporting semiconductor slice cassettes in a clean room environment which shields the semiconductor slices from VLF air in people-occupied areas. The apparatus is also designed so as to minimize particulate generation resulting from frictional contact of the constituent parts of the apparatus.

Although the preferred embodiment has been described in detail, it should be understood that various changes, substitutions and alterations can be made therein without departing from the spirit and scope of the invention as defined by the appended claims.

What is claimed is:

1. An apparatus for carrying a semiconductor slice cassette, comprising:
 a base;
 a cover for disposal on said base to provide a sealed volume therewith;
 sealing means disposed about the periphery of said base for sealing cover onto said base;

a cassette receiving and supporting cradle carried on said base and having non-abrasive surfaces for cooperating with the cassette to provide support therefor while minimizing particulate generation resulting from friction between the receiving and supporting means and the cassette surfaces;

wherein said non-abrasive surfaces of said cradle are positioned to receive the cassette such that the cassette is tilted for causing semiconductor slices contained within the cassette to rest against a back portion of the cassette to prevent the slices from sliding out of the cassette;

at least one high efficiency particle filter mounted on said base for filter air entering said sealed volume;

latch means for latching said cover onto said base;

at least one resilient spring positioned on said base and upon which said cradle is mounted for providing shock absorption and mechanical isolation for the cassette during transporting and handling of the carrying apparatus; and means on said cradle for removably engaging the cassette.

2. The carrying apparatus of claim 1 further comprising guides positioned on the bottom surface of said base for facilitating positioning of said carrier on a supporting platform.

3. The carrying apparatus of claim 1 wherein said non-abrasive surfaces of said cradle are constructed of polished metal.

4. The carrying apparatus of claim 1 wherein said sealing means comprises a soft double contact seal fitted into a slot positioned about the periphery of said base for contacting said cover to provide a leak-tight joint between said cover and said base.

5. The carrying apparatus of claim 1 further comprising guide means positioned on said base for preventing misalignment of the cover during placement of the cover onto the base.

* * * * *